United States Patent
Wang et al.

(10) Patent No.: US 10,506,725 B2
(45) Date of Patent: Dec. 10, 2019

(54) ALIGNMENT MARK, CIRCUIT BOARD AND DISPLAY DEVICE

(71) Applicant: BOE TECHNOLOGY GROUP CO., LTD., Beijing (CN)

(72) Inventors: Tieshi Wang, Beijing (CN); Wanpeng Teng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 580 days.

(21) Appl. No.: 14/908,873

(22) PCT Filed: Aug. 14, 2015

(86) PCT No.: PCT/CN2015/087026
§ 371 (c)(1),
(2) Date: Jan. 29, 2016

(87) PCT Pub. No.: WO2016/145779
PCT Pub. Date: Sep. 22, 2016

(65) Prior Publication Data
US 2017/0048988 A1    Feb. 16, 2017

(30) Foreign Application Priority Data
Mar. 17, 2015 (CN) .......................... 2015 1 0116925

(51) Int. Cl.
*H05K 5/00* (2006.01)
*G09F 9/30* (2006.01)
(Continued)

(52) U.S. Cl.
CPC .............. *H05K 5/0017* (2013.01); *G09F 9/30* (2013.01); *H05K 1/0269* (2013.01); *H05K 1/111* (2013.01);
(Continued)

(58) Field of Classification Search
USPC .......................................................... 361/760
See application file for complete search history.

(56) References Cited

U.S. PATENT DOCUMENTS

| 5,739,887 A * | 4/1998 | Ueda ................. G02F 1/133604 349/149 |
| 2003/0052440 A1* | 3/2003 | Tsuura ................. H01L 23/5258 267/100 |

(Continued)

FOREIGN PATENT DOCUMENTS

| CN | 1131751 A | 9/1996 |
| CN | 1335530 A | 2/2002 |

(Continued)

OTHER PUBLICATIONS

First Office Action dated Mar. 24, 2017 corresponding to Chinese application No. 201510116925.7.

(Continued)

*Primary Examiner* — Andargie M Aychillhum
(74) *Attorney, Agent, or Firm* — Nath, Goldberg & Meyer; Joshua B. Goldberg

(57) ABSTRACT

The present invention discloses an alignment mark, a circuit board and a display device, the alignment mark is configured to position a to-be-bonded component during a bonding process and is constituted by first gold fingers provided in a bonding area of the to-be-bonded component. The alignment mark provided by the present invention is arranged in the bonding area and does not additionally occupy an effective area of the circuit board, which allows the circuit board to accommodate more components, thereby improving utilization ratio of the circuit board and meeting the need of narrow edge for the circuit board.

13 Claims, 2 Drawing Sheets

(51) Int. Cl.
  H05K 1/02  (2006.01)
  H05K 1/11  (2006.01)
(52) U.S. Cl.
  CPC .............. *H05K 2201/09918* (2013.01); *H05K 2203/166* (2013.01); *Y02P 70/611* (2015.11)

(56) References Cited

U.S. PATENT DOCUMENTS

| | | | | |
|---|---|---|---|---|
| 2005/0218513 | A1* | 10/2005 | Seko | H01L 21/563 257/734 |
| 2007/0099396 | A1* | 5/2007 | Hirai | H05K 1/0269 438/460 |
| 2007/0275578 | A1* | 11/2007 | Yamada | H05K 1/0269 439/79 |
| 2015/0029680 | A1* | 1/2015 | Saito | H05K 1/0269 361/748 |
| 2016/0274317 | A1* | 9/2016 | Tsujita | G02B 6/4214 |

FOREIGN PATENT DOCUMENTS

| | | |
|---|---|---|
| CN | 1722930 A | 1/2006 |
| CN | 1802080 A | 7/2006 |
| CN | 101287329 A | 10/2008 |
| CN | 102033340 A | 4/2011 |
| CN | 201909918 U | 7/2011 |
| CN | 103616976 A | 3/2014 |
| CN | 104661430 A | 5/2015 |
| JP | 2004012763 A | 1/2004 |
| KR | 20120139305 A | 12/2012 |

OTHER PUBLICATIONS

PCT/ISA/210 for corresponding International patent application PCT/CN2015/087026 with English translation (PCT/ISA/237) dated Nov. 30, 2015.

\* cited by examiner

ALIGNMENT MARK, CIRCUIT BOARD AND DISPLAY DEVICE

This is a National Phase Application filed under 35 U.S.C. 371 as a national stage of PCT/CN2015/087026, filed Aug. 14, 2015, an application claiming the benefit of Chinese Application No. 201510116925.7, filed Mar. 17, 2015, the content of each of which is hereby incorporated by reference in its entirety.

FIELD OF THE INVENTION

The present invention relates to the field of integrated circuit technology, and particularly relates to an alignment mark, a circuit board and a display device.

BACKGROUND OF THE INVENTION

FIG. 1 is a schematic diagram of a configuration of alignment marks in the prior art. As shown in FIG. 1, alignment marks 102 are provided at both sides, i.e., left and right sides, of a bonding area 101, and left and right directions here refer to the "left and right" directions illustrated in FIG. 1. FIG. 2 is a schematic diagram of another configuration of alignment marks in the prior art. As shown in FIG. 2, alignment marks 102 are provided under a bonding area 101, and the "down" direction here refers to the "down" direction illustrated in FIG. 2. The foregoing alignment marks are provided under, or at left and right sides of, a bonding area, so areas in which the alignment marks are provided cannot be provided therein with other component, in this case, part of area on a circuit board is wasted, and the circuit board thus has a lower utilization ratio and relatively large volume. Therefore, the need of narrow edge for a circuit board can hardly be satisfied.

SUMMARY OF THE INVENTION

In view of the problem that alignment marks in the prior art lower utilization ratio of a circuit board and cannot satisfy the need of narrow edge for the circuit board, an object of the present invention is to provide an alignment mark, a circuit board and a display device.

To achieve the above object, according to an aspect of the present invention, there is provided an alignment mark configured to position a to-be-bonded component during a bonding process, and the alignment mark is constituted by first gold fingers provided in a bonding area of the to-be-bonded component.

According to another aspect of the present invention, there is provided a circuit board, which comprises a base with a bonding area provided thereon, and a plurality of second golden fingers spaced apart from each other and at least two alignment marks described above are provided in the bonding area.

Optionally, the number of the alignment marks is two, and the two alignment marks are provided at two opposite ends of the bonding area.

Optionally, a box configured to distinguish the first gold fingers from the second gold fingers is provided in the bonding area.

Optionally, the box has a color different from that of the second golden finger.

Optionally, the color of the box is black or red.

Optionally, the first gold finger has a shape different from that of the second golden finger.

Optionally, the first gold finger is S-shaped or zigzag-shaped.

Optionally, the circuit board is a printed circuit board.

According to still another aspect of the present invention, there is provided a display device comprising any one of the above circuit boards.

The present invention has the following beneficial effects: In the alignment mark, circuit board and display device provided by the present invention, the alignment mark is provided on the circuit board to position a to-be-bonded component in a bonding process and is constituted by first gold fingers provided in a bonding area of the circuit board. The alignment mark provided by the present invention is arranged in the bonding area and does not occupy an effective area of the circuit board additionally, which allows the circuit board to accommodate more components, thereby improving utilization ratio of the circuit board and meeting the need of narrow edge for the circuit board.

DETAILED DESCRIPTION OF THE EMBODIMENTS

To enable those skilled in the art to better understand the technical solutions of the present invention, the alignment mark, circuit board and display device provided by the present invention will be described in detail below in conjunction with the accompanying drawings.

First Embodiment

Figure 1:
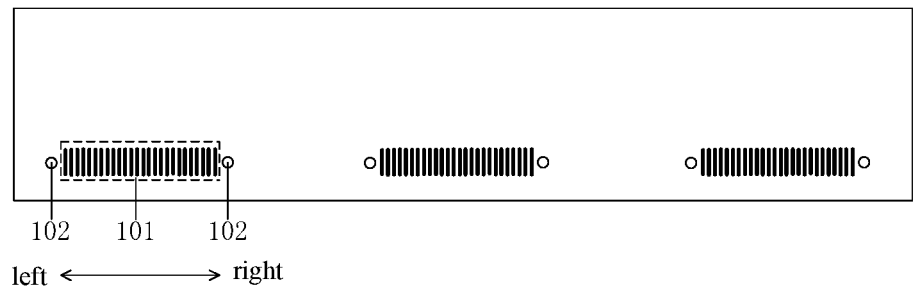
FIG. 1 is a schematic diagram of a configuration of alignment marks in the prior art.
Figure 2:
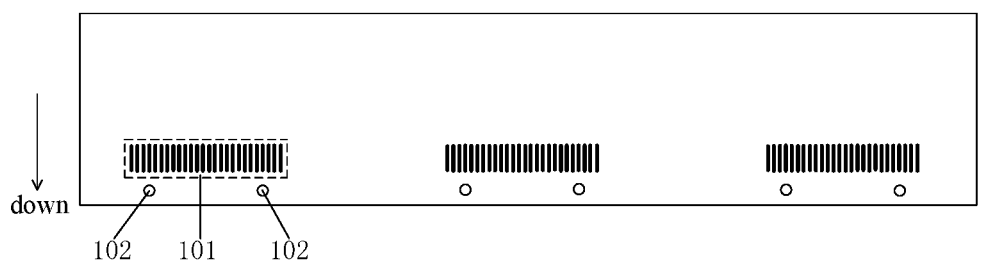
FIG. 2 is a schematic diagram of another configuration of alignment marks in the prior art.
Figure 3:
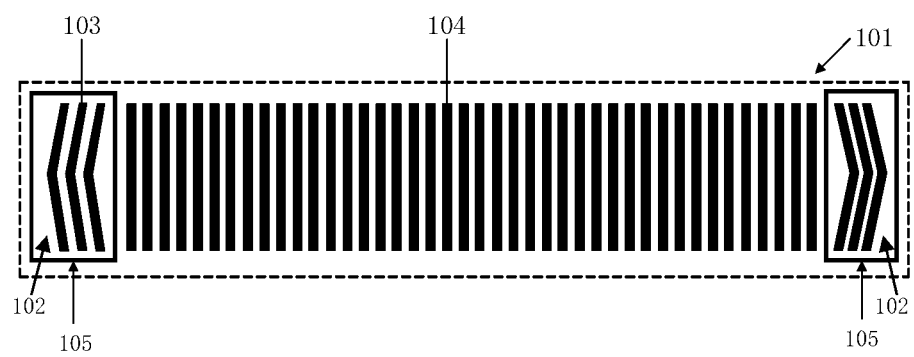
FIG. 3 is a schematic diagram of a configuration of alignment marks provided by a first embodiment of the present invention.

FIG. 3 is a schematic diagram of a configuration of alignment marks provided by a first embodiment of the present invention. As shown in FIG. 3, alignment marks 102 are provided in a bonding area 101, configured to position a to-be-bonded component in a bonding process, and constituted by first gold fingers 103 provided in a bonding area of the to-be-bonded component. A plurality of second golden fingers 104 spaced apart from each other are also provided in the bonding area 101. In one bonding area 101, the number of the alignment marks 102 may be two, and the two alignment marks 102 may be provided at two opposite ends of the bonding area 101, respectively.

Those skilled in the art should understand that, in the process of bonding two components, both components may be considered as the to-be-bonded component; both components may be circuit boards (e.g., printed circuit boards, PCBs for short); alternatively, one component may be a circuit board and the other one is other component. This embodiment is described by taking a case that the to-be-bonded component is a circuit board as an example.

A gold finger is an interface for connecting a line of a circuit board to an external component, and can be also referred to as conductive contact. Preferably, the shape of the first gold finger 103 is different from that of the second gold finger 104. As shown in FIG. 3, in this embodiment, the first gold finger 103 is a flake-like pad that is zigzag-shaped, and the second gold finger 104 is a flake-like pad that is rectangular-shaped. An anisotropic conductive adhesive is coated on the first gold fingers 103 and the second gold fingers 104, and then the circuit board is bonded to another component (e.g., a PCB or other component) through the anisotropic conductive adhesive.

Figure 4:
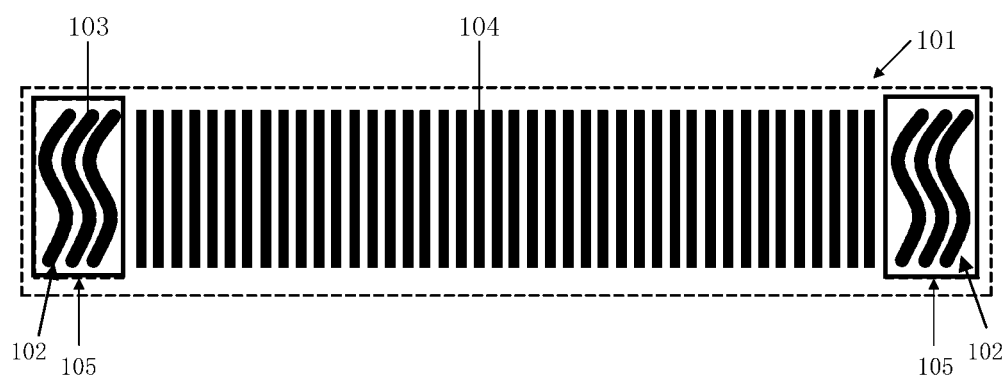
FIG. 4 is a schematic diagram of another configuration of alignment marks provided by the first embodiment of the present invention.

FIG. 4 is a schematic diagram of another configuration of alignment marks provided by the first embodiment of the present invention. As shown in FIG. 4, alignment marks 102 are provided in a bonding area 101, configured to position a to-be-bonded component in a bonding process and constituted by first gold fingers 103 provided in a bonding area of the to-be-bonded component (e.g., a circuit board). A plurality of second golden fingers 104 spaced apart from each other are also provided in the bonding area 101. As shown in FIG. 4, in this embodiment, the first gold finger 103 is S-shaped and the second gold finger 104 is rectangular-shaped.

In the above embodiment, the first gold fingers 103 constituting the alignment mark 102 and the second gold fingers 104 differentiate from each other, so that the alignment mark 102 can be easily captured by a camera, which facilitates precise positioning.

It could be understood that, in the process of bonding the circuit board to another component, in order to align the circuit board with said component, said component is also provided with an alignment mark, which may be similar to the alignment mark 102 provided by this embodiment and is not repeatedly described herein.

In this embodiment, since the alignment mark is arranged in the bonding area and does not additionally occupy an effective area of the circuit board, which allows the circuit board to accommodate more components, thereby improving utilization ratio of the circuit board and meeting the need of narrow edge for the circuit board.

Second Embodiment

Figure 5:
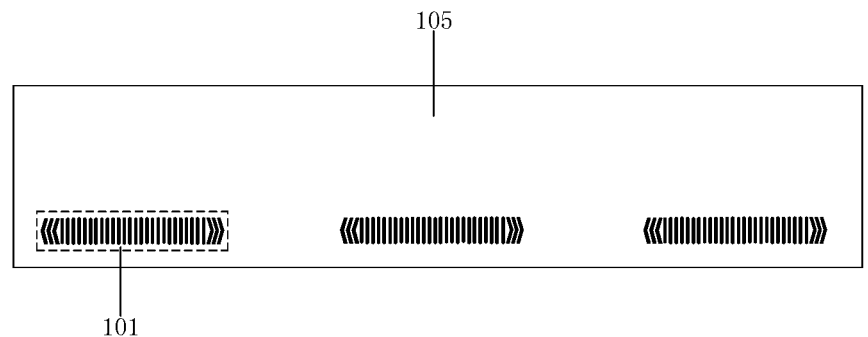
FIG. 5 is a schematic diagram of a structure of a circuit board provided by a second embodiment of the present invention.

FIG. 5 is a schematic diagram of a structure of a circuit board provided by a second embodiment of the present invention, and the circuit board adopts the alignment mark shown in FIG. 3. Referring to FIGS. 3 and 5, the circuit board includes a base 105, on which bonding areas 101 are provided, and the alignment marks 102 provided by the first embodiment are provided in each bonding area 101. The alignment mark 102 is configured to position a to-be-bonded component in a bonding process and is constituted by first gold fingers 103 provided in the bonding area 101. A plurality of second golden fingers 104 spaced apart from each other are also provided in the bonding area 101. In one bonding area 101, the number of the alignment marks 102 may be two, and the two alignment marks 102 may be provided at two opposite ends of the bonding area 101, respectively; alternatively, the number of the alignment marks 102 in one bonding area 101 may be more than two.

A gold finger is an interface for connecting a line of a circuit board to an external component, and can be also referred to as conductive contact. An anisotropic conductive adhesive is coated on the first gold fingers 103 and the second gold fingers 104, and then the circuit board is bonded to another component through the anisotropic conductive adhesive. During the bonding process, in order that the alignment mark 102 can be easily captured by a camera, so as to facilitate precise positioning, the first gold fingers 103 constituting the alignment mark 102 should differentiate from the second gold fingers 104.

In an example, the first gold finger 103 may have a shape different from that of the second gold finger 104. Preferably, the first gold finger 103 may be S-shaped as shown in FIG. 4 or zigzag-shaped as shown in FIG. 3, and the second gold finger 104 is rectangular-shaped.

In another example, a box 105, which is configured to distinguish the first gold fingers 103 constituting the alignment mark 102 from the second gold fingers 104, may be provided in the bonding area of the circuit board, for example, the box 105 may be a rectangular box provided surrounding the alignment mark 102. In order to further distinguish the alignment mark 102 from the second gold fingers 104, the color of the box 105 may be set to be different from that of the second gold fingers 104. The color of the box 105 may be black or red, so that the alignment mark 102 can be captured by the camera more easily, so as to implement accurate positioning.

It could be understood that, in the process of bonding the circuit board to another component, in order to align the circuit board with said component, said component is also provided with an alignment mark, which may be similar to the alignment mark 102 in the circuit board provided by this embodiment and is not repeatedly described herein. In addition, as described above, the circuit board may be a PCB (e.g., a flexible PCB, a rigid PCB, or the like).

In the circuit board provided by this embodiment, since the alignment mark is arranged in the bonding area and does not additionally occupy an effective area of the circuit board, which allows the circuit board to accommodate more components, thereby improving utilization ratio of the circuit board and meeting the need of narrow edge for the circuit board.

Third Embodiment

This embodiment provides a display device comprising the circuit board provided by the second embodiment, and the specific description of the circuit board may refer to that in the above second embodiment and is not repeatedly given herein.

In the display device provided by this embodiment, since the alignment mark is arranged in the bonding area and does not additionally occupy an effective area of the circuit board, which allows the circuit board to accommodate more components, thereby improving utilization ratio of the circuit board and meeting the need of narrow edge for the circuit board.

It should be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A circuit board, comprising a base, on which a bonding area is provided, wherein at least two alignment marks and a plurality of second golden fingers are provided in the bonding area, the second golden fingers are spaced apart from each other, each of the at least two alignment marks is configured to position the circuit board during a bonding process and consists of a plurality of first gold fingers provided in the bonding area of the circuit board, each of the plurality of first gold fingers of the alignment mark has an identical pattern, each of the plurality of first gold fingers has an even width throughout an entire body of each finger, and the plurality of first gold fingers are spaced apart from and parallel to each other, wherein the circuit board further comprises, in the bonding area, a rectangular box configured to distinguish the plurality of first gold fingers from the plurality of second golden fingers and surround the plurality of first gold fingers of one of the at least two alignment marks, and each of the plurality of first gold fingers has a shape different from that of each of the plurality of second golden fingers.

2. The circuit board according to claim 1, wherein the number of the alignment marks is two, and the two alignment marks are provided at two opposite ends of the bonding area.

3. The circuit board according to claim 2, wherein each of the plurality of first gold fingers is S-shaped or zigzag-shaped.

4. The circuit board according to claim 1, wherein the box has a color different from that of the plurality of second golden fingers.

5. The circuit board according to claim 4, wherein the color of the box is black or red.

6. The circuit board according to claim 1, wherein each of the plurality of first gold fingers is S-shaped or zigzag-shaped.

7. The circuit board according to claim 1, wherein the circuit board is a printed circuit board.

8. A display device, comprising a circuit board, which comprises a base, on which a bonding area is provided, wherein at least two alignment marks and a plurality of second golden fingers are provided in the bonding area, the second golden fingers being spaced apart from each other, and each of the at least two alignment marks is configured to position the circuit board during a bonding process and consists of a plurality of first gold fingers provided in the bonding area of the circuit board, each of the plurality of first gold fingers of the alignment mark has an identical pattern, each of the plurality of first gold fingers has an even width throughout an entire body of each finger, and the plurality of first gold fingers are spaced apart from and parallel to each other, wherein the circuit board further comprises, in the bonding area, a rectangular box configured to distinguish the plurality of first gold fingers from the plurality of second golden fingers and surround the plurality of first gold fingers of one of the at least two alignment marks, and each of the plurality of first gold fingers has a shape different from that of each of the plurality of second golden fingers.

9. The display device according to claim 8, wherein the number of the alignment marks is two, and the two alignment marks are provided at two opposite ends of the bonding area.

10. The display device according to claim 8, wherein the box has a color different from that of the plurality of second golden fingers.

11. The display device according to claim 10, wherein the color of the box is black or red.

12. The display device according to claim 8, wherein each of the first gold fingers is S-shaped or zigzag-shaped.

13. The display device according to claim 8, wherein the circuit board is a printed circuit board.

* * * * *